United States Patent
Kim

Patent Number: 6,072,410
Date of Patent: Jun. 6, 2000

[54] CODING/DECODING METHOD FOR HIGH DENSITY DATA RECORDING AND REPRODUCTION

[75] Inventor: Jin-sook Kim, Yongin, Rep. of Korea

[73] Assignee: Samsung Electronics Co., Ltd., Suwon, Rep. of Korea

[21] Appl. No.: 09/026,922

[22] Filed: Feb. 20, 1998

[30] Foreign Application Priority Data

Oct. 7, 1997 [KR] Rep. of Korea ............ 97-51446

[51] Int. Cl.$^7$ .................................................. H03M 7/00
[52] U.S. Cl. .................................. 341/81; 341/59; 341/106
[58] Field of Search .................................. 341/58, 59, 81, 341/95, 106; 714/799

[56] References Cited

U.S. PATENT DOCUMENTS

| | | | |
|---|---|---|---|
| 5,537,112 | 7/1996 | Tsang | 341/59 |
| 5,635,933 | 6/1997 | Fritzpatrick et al. | 341/58 |
| 5,862,157 | 1/1999 | Bessios | 714/799 |

FOREIGN PATENT DOCUMENTS 0751522  1/1997  European Pat. Off. .

OTHER PUBLICATIONS

IBM Technical Disclosure Bulletin, vol. 31, No. 8, Jan. 1989, pp. 21–23, XP002104789.

IBM Technical Disclosure Bulletin, vol. 31, No. 8, Jan. 1989, pp. 455–457, XP0022104790.

P.H. Siegel and J.K. Wolf: "Modulation and Coding for Information Storage", IEEE Communications Magazine, vo. 29, No. 12, Dec. 1991, pp. 68–86, XP000287983.

*Primary Examiner*—Brian Young
*Assistant Examiner*—Patrick Wamsley
*Attorney, Agent, or Firm*—Kile, McIntyre, Harbin & Lee; Eugene M. Lee

[57] ABSTRACT

A coding/decoding method for high density data recording and reproduction uses 16/17 RLL(0,6/6) coding/decoding, and by adopting an encoder/decoder having a more straightforward structure, the coding/encoding method can reduce the size of the hardware required. An optimal lookup table as well as a simplified relational equation are provided between input and output for encoding/decoding the rate 16/17 RLL(0,6/6) block code.

20 Claims, 2 Drawing Sheets

CODING/DECODING METHOD FOR HIGH DENSITY DATA RECORDING AND REPRODUCTION

BACKGROUND OF THE INVENTION

1. Field of the Invention

The present invention relates to an coding/decoding method for a high density data recording and reproduction, and more particularly, to a coding/decoding method for a high density data recording and reproduction in a partial response maximum likelihood (PRML) channel.

2. Description of the Related Art

Much research has been conducted on methods for recording data with a high density in a given storage capacity and transferring reliable information at high speed. As an effort to achieve high speed processing on large quantities of data in a data storage device, various methods relating to physical properties have been attempted. The methods include improvement in the physical properties of a storage disk and in the precision of a data storing apparatus. Also, as an aspect of signal processing, the methods include a method of reducing data detection error, a method of increasing the recording density of a storage device by effective encoding and a method for facilitating detection of a reproduction signal have been proposed.

Currently, due to the increase in the amount of data to be processed, much higher recording densities are required in storage devices. To achieve this objective, the data to be recorded in the storage device is encoded to increase the recording density and facilitate the detection of a reproduction signal. Thus, as the recording density in the storage device increases, encoding allows large quantities of useful information to be recorded on a storage disk having a predetermined size. Accordingly, an effective coding method is required such that the recording density is increased and detection of signals is facilitated.

In general, as a useful coding method for a storage device, there is a run length limited (RLL) method satisfying a (d,k) condition. That is, according to the RLL(d,k) coding method, the number of successive "0"s between "1"s is limited to the minimum d and the maximum k. The aim of this coding method is to reduce interference between signals while maintaining a self-clocking characteristic of a data signal. Thus, the former d is for facilitating signal detection, and the latter k is for maintaining the timing for restoring a reproduction signal.

RLL coding methods have recently used as the RLL code, rate 1/2 RLL(2,7) modulation code, rate 2/3 RLL(1,7) modulation code, rate 8/9 RLL(0,3) modulation code, rate 8/9 RLL(0,4/4) modulation code, etc. According to the rate 1/2 RLL(2,7) modulation code and rate 2/3 RLL(1,7) modulation code, the number of "0"s between "1"s is equal to 1 and 2, respectively. Accordingly, interference between signals is decreased while redundancy is high due to the low code rate.

Also, since the value of "k" is comparatively smaller than those of the rate 8/9 RLL(0,3) and rate 8/9 RLL(0,4/4) modulation codes, it holds much timing information which is helpful in the operation of a phase locked loop (PLL).

Generally, when recording or reproducing data on or from a storage device, a channel must be modeled similarly to an actual channel. Channel characteristics of the storage device can be expressed by the following equation (1).

$$(1+D)^n, \text{ or } (1-D)(1+D)^n \tag{1}$$

where n=1, ..., 2.

Partial response maximum likelihood (PRML) pre-codes input a signal to provide controlled inter-symbol interference (ISI) between a current data and a previous data, and then modifies the same into the following target response (2).

$$d_k = a_k + a_{k-1} \text{ or } d_k = a_k - a_{k-2} \tag{2}$$

Data, is then detected using a Viterbi decoder. The PRML method exhibits excellent detecting capacity in a channel in which n=1.

RLL codes with a "d" greater than zero are not necessary in PRML channels. Since the compensation for the ISI is inherent in a maximum likelihood (ML) detector, it is preferable to increase the channel signal-to-noise ratio (SNR) while reducing interference between signals by increasing the code rate, rather than by reducing the interference by coding. This is because the code rate is dependent on d.

Thus, the rate 8/9 RLL(0,4/4) coding and rate 16/17RLL (0,6/6) coding methods are incorporated into the PRML method utilizing the interference between signals to improve performance while maintaining a high recording density and holding more timing information. Also, since the rate 8/9 RLL(0,3) coding and the rate 16/17 RLL(0,6/6) coding methods have a high code rate, a good effect is provided to an equalizer with respect to a given partial response class due to its higher channel SNR compared to the rate 1/2 RLL(2,7) coding or rate 2/3 RLL(1,7) coding method.

If the data sequence of an input signal is divided into an even-bit subsequence and an odd-bit subsequence, ML detection is independently applied to each subsequence. Also, the number of continuous zeros in each subsequence causes a delay in detection, and limits the hardware size. The maximum number of continuous "1"s between "1"s required for each subsequence is called "k1". The condition of k1 required for each subsequence is to reduce a path memory for the ML detector. The RLL(0,k/k1) modulation code satisfying the above condition is the rate 8/9 RLL(0,4/4) modulation code and the rate 16/17 RLL(0,6/6) modulation code. The rate 16/17 RLL(0,6/6) modulation code provides a higher rate than the rate 8/9 RLL(0,4/4) modulation code, and the recording can be performed on the data storage device with a much higher recording density. Thus, the rate 16/17 RLL(0,6/6) modulation code is a preferred coding method in PRML channels.

However, in the conventional rate 16/17 RLL(0,6/6) modulation code, there is a significant problem in that the hardware size of an encoder and a decoder required is comparatively great. This hardware size reduces the attractiveness of 16/17 RLL (o,6/6) modulation code because of the cost increases associated with the increased size.

SUMMARY OF THE INVENTION

To solve the above and other drawbacks, it is an object of the present invention to provide a coding method which is suitable for a partial response maximum likelihood (PRML) channel, for high density data recording and reproduction.

It is another object of the present invention to provide a decoding method which is suitable for the coding method.

To achieve the first object, there is provided a coding method for encoding a binary data symbol $X_k$ (k=1, 2, 3, ...) having a predetermined number of bits (k), received from a storage device or a communications channel, into a codeword $Y_l$ (l=1, 2, 3, ...) having a predetermined number of bits (l), the coding method comprising the steps of: (a) dividing the binary data symbol $X_k$ into a first group having odd bits or even bits, and a second group having other bits; (b) mapping the first group into a codeword having a predetermined number of bits; and (c) interleaving the second group with the mapped codewords, and outputting the result as the codeword $Y_l$.

To achieve the second object, there is provided a decoding method for decoding a codeword $Y_l$ (l=1, 2, 3, . . . ) having a predetermined number of bits (l), received from a storage device or a communications channel, into a binary data symbol $X_k$ (k=1, 2, 3, . . . ) having a predetermined number of bits (k), the decoding method comprising the steps of: (a) dividing the codeword $Y_l$ into a first group having odd bits or even bits, and a second group having other bits; (b) decoding the first group into a codeword having a predetermined number of bits; and (c) deinterleaving the second group with the decoded codewords, and outputting the result as the binary data symbol $X_k$.

According to the coding/decoding method of the present invention, the encoder/decoder adopting the coding/decoding method has reduced hardware size due to its straight forward structure. Also, the present invention provides an optimal lookup table between an input and output with respect to the coding and decoding of the rate 16/17 RLL(0,6/6) block code, and a simplified relational equation between the input and output.

BRIEF DESCRIPTION OF THE DRAWINGS

The above objects and advantages of the present invention will become more apparent by describing in detail a preferred embodiment thereof with reference to the attached drawings, in which.

DESCRIPTION OF THE PREFERRED EMBODIMENT

The present invention provides among other things a coding/decoding method of a modulation code which is suitable for partial response (PR) channels for maximum likelihood (ML) detection. Such modulation code provides frequent non-zero samples, to improve the timing of a channel and the performance of a gain control circuit. Also, during the process by a Viterbi detector, paths are forcibly merged to reduce the capacity of a path memory, thereby limiting the complexity of the ML detector.

A modulation code according to the present invention is expressed by three parameters d, k and k1. The parameters d and k represent the minimum run length and the maximum run length of each codeword, and the parameter k1 represents the maximum run length of zeros in an even-bit subsequence or an odd-bit subsequence.

In the code of the present invention, the d constraint is "0". The reason for this is that the minimum run length of zero value is not necessary in the PRML channel. The small k is required for precision in the timing and gain control, k1 reduces the size of a path memory required for the ML detectors.

The k and k1 parameters with respect to the rate 16/17 RLL(0,k/k1) block are (0,6/6). The present invention provides a lookup table for coding/decoding the rate 16/17 block code having such parameters. Also, a simplified relational equation with respect to the coding/decoding is provided.

Figure 1:
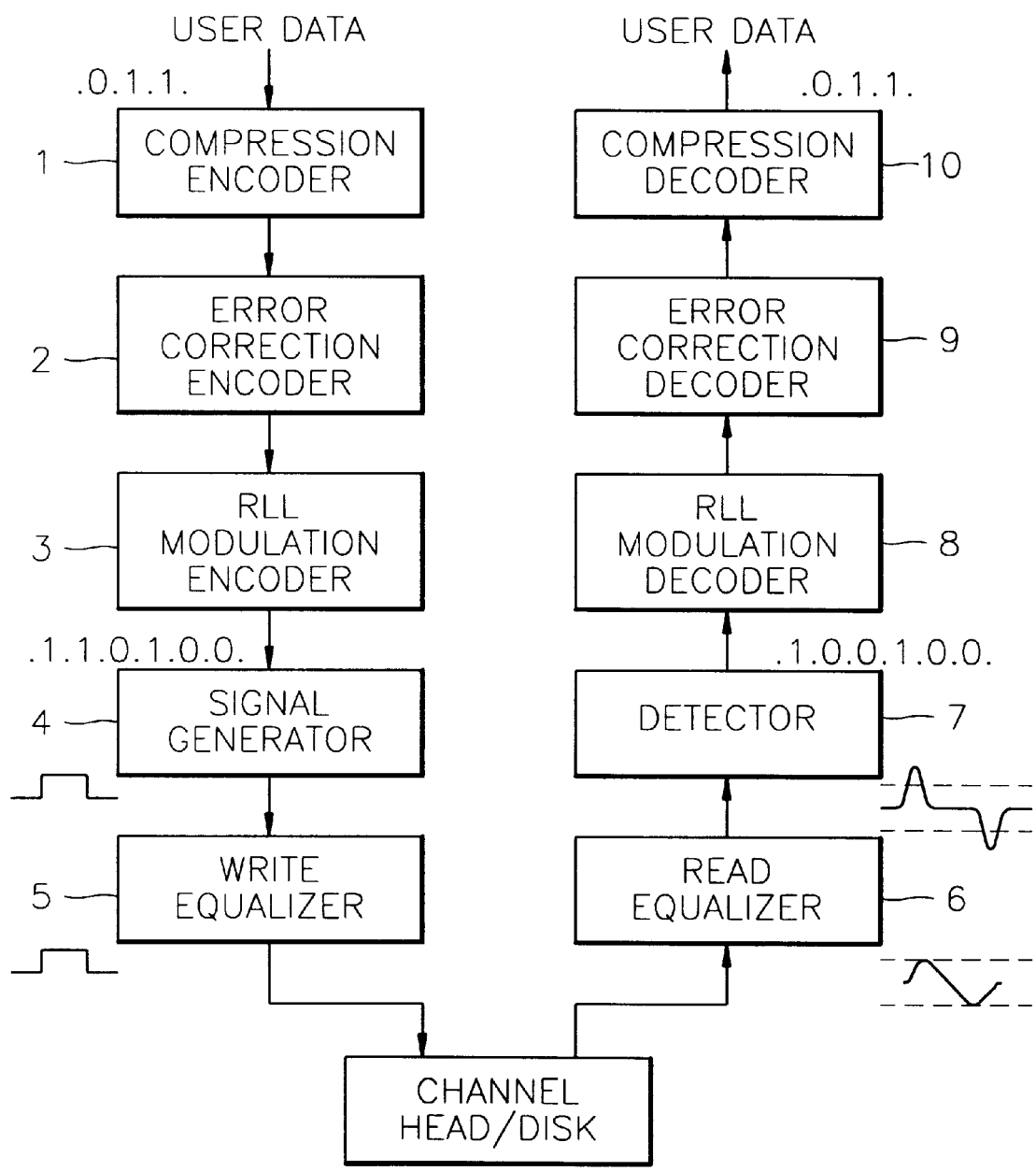
FIG. 1 is a block diagram showing the structure of an encoder/decoder for high density data recording and reproduction.

FIG. 1 is a block diagram showing the structure of a coding/decoding system for high density data recording and reproduction the data. The operation of the system shown in FIG. 1 will be described as follows.

A user data to be recorded on a storage device becomes protected against noises or other factors causing various kinds of signal distortion via a compression encoder 1 and an error correction encoder 2. Then the signal is coded by a run length limited (RLL) modulation encoder 3 which is suitable for the channel characteristics of the storage device. Then, the modulated data is input to a signal generator 4 to generate a signal, and pre-compensated for by a write equalizer 5 to be written on a head/disk composing a channel. The signal written on the head/disk are reproduced and then processed by a read equalizer 6 such that the signal is detected easily. Then, a signal is detected by a detector 7 to minimize an error probability. The signal detected by the detector 7 is restored into the original user data via an RLL modulation decoder 8 and an error correction decoder 9 and a compression decoder 10.

Figure 2:
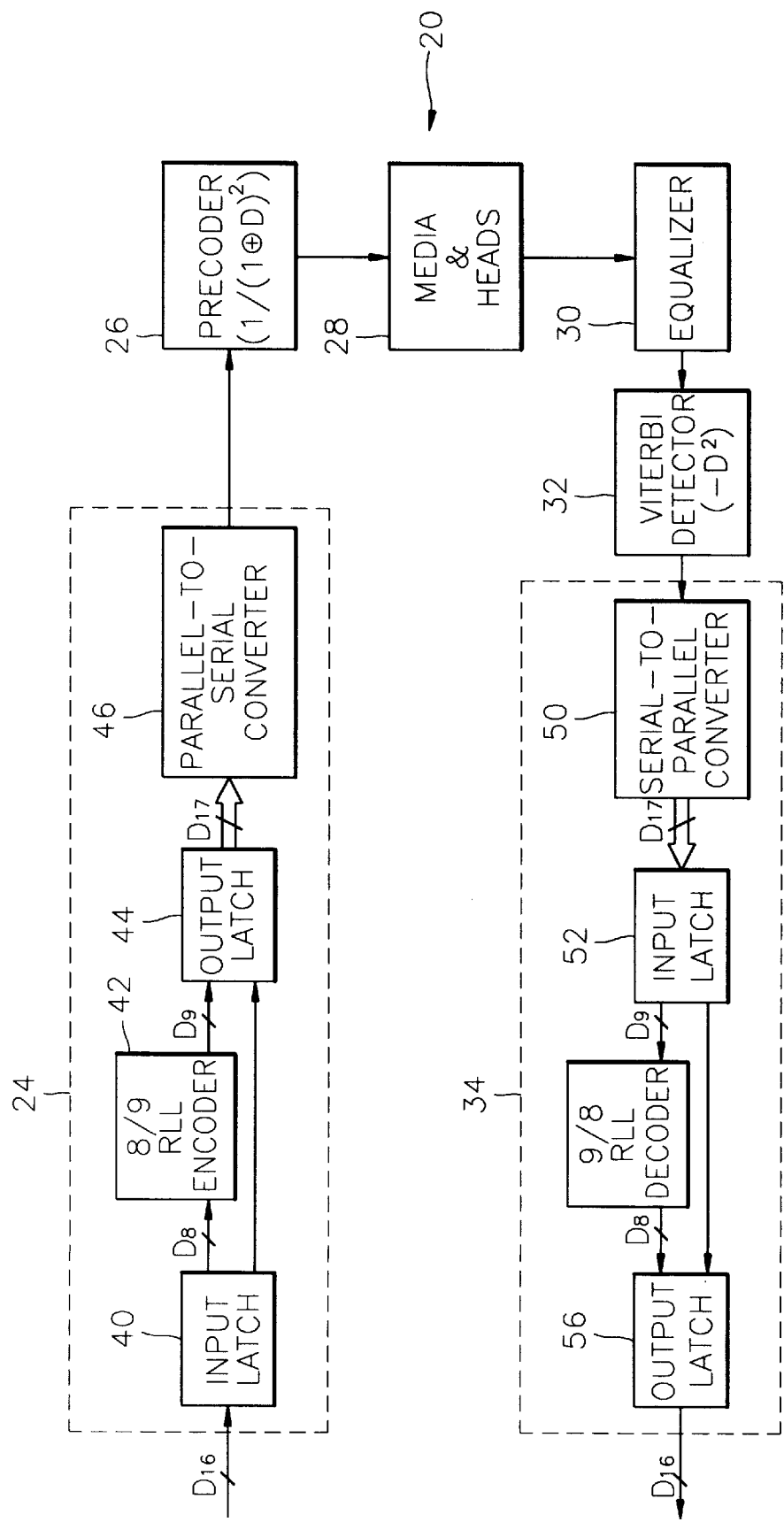
FIG. 2 is a block diagram showing the structure of an encoder/decoder to which a coding/decoding method according to the present invention is applied.

FIG. 2 is a detailed block diagram of an encoding/decoding system using the coding/decoding method according to the present invention. In the system 20 shown in FIG. 2, the rate 16/17 RLL(0,6/6) codeword is used as a binary data to be written. The system 20 includes an encoder 24, a precoder 26, media & heads 28, an equalizer 30, a Viterbi detector 32 and a decoder 34.

In FIG. 2, $D_{16}$ represents user data input in groups of 16 bits, and $D_{17}$ represents an encoded 17-bit codeword. In the system 20, the encoder 24 receives the input data $D_{16}$ in groups of 16 bits to encode the corresponding 17-bit codeword $D_{17}$. The precoder 26 has a transfer function $1/(1 \oplus D)^2$ which is appropriate for use in the partial response class 4 (PR 4), and the media & heads 28 has a media to be a partial response read signal channel and heads for reading the encoded data from the media and recording data thereon. Also, the decoder 34 decodes the 17-bit codeword $D_{17}$ into the user data $D_{16}$ in groups of 16 bits.

In detail, the encoder 24 includes an input latch 40, an 8/9 RLL encoder 42, an output latch 44 and a parallel-to-serial converter 46. The input data $D_{16}$ input to the system 20 is divided into two groups of 8 bits each via the input latch 40. Here, supposing that the first group of 8 bits is "group A" and the second group of 8 bits is "group B", the groups A and B can be expressed as follows.

$$A=[A_7,A_6,A_5,A_4,A_3,A_2,A_1,A_0]$$

$$B=[B_7,B_6,B_5,B_4,B_3,B_2,B_1,B_0]$$

The 8/9 RLL encoder 42 performs a logic function (described below) to map the group A into a 9-bit codeword C.

$$C=[C_8,C_7,C_6,C_5,C_4,C_3,C_2,C_1,C_0]$$

The output latch 44 interleaves the group B and the 9-bit codeword C to output a 17-bit codeword W which satisfies the given 16/17 RLL(0,6/6) code.

$$W=[C_8,B_7,C_7,B_6,C_6,B_5,C_5,B_4,C_4,B_3,C_3,B_2,C_2,B_1,C_1,B_0,C_0]$$

The parallel-to-serial converter 46 provides the 17-bit codeword W to the precoder 26, and the precoder 26 provides its output to the media & heads 28. Such encoded 17-bit codeword W is input to the equalizer 30 via the media & heads 28, and the equalizer 30 equalizes the signal to a desired target signal according to the PR4.

Then, the signal goes through the Viterbi detector 32. The detected sequence is grouped by the serial-to-parallel converter 50 by as much as 17 bits. Then, each bit group is divided into 9 bits and 8 bits by the input latch 52. The first 9-bit group is decoded into an 8-bit data via the 9/8 RLL decoder 54, and the obtained 8-bit data is deinterleaved with one 8-bit group by the output latch 56, to output a 16-bit data as originally input.

Each codeword W is divided into two subsequences: a first subsequence $W_1$ and a second subsequence $W_2$. The first subsequence $W_1$ includes odd bits of 17-bit codeword W and the second subsequence $W_2$ includes even bits of the 17-bit codeword W, as follows.

$$W_1 = [C_8, C_7, C_6, B_5, B_4, B_3, B_2, C_1, C_0]$$

$$W_2 = [B_7, B_6, C_5, C_4, C_3, C_2, B_1, B_0]$$

In order to obtain 16/17 RLL(0,6/6), the first 8-bit group A must be effectively mapped into a 9-bit codeword C. That is, the 8/9 RLL encoder 42 must provide a 17-bit codeword W which satisfies the given constraints even in the worst case where the group B of the input 8-bit data includes all zeros. That is, in order to satisfy the condition in which d is equal to 0, and both K and k1 are equal to 6 in the RLL(0,k/k1) constraints, the codeword C encoded from the first 8-bit binary data must satisfy the following constraints. Here, "+" represents a logical OR operation, and "·" represents a logical AND operation.

$$C_8 + C_7 + C_6 = 1$$

$$C_1 + C_0 = 1$$

$$C_7 + C_6 + C_5 + C_4 = 1$$

$$C_6 + C_5 + C_4 + C_3 = 1$$

$$C_3 + C_2 + C_1 = 1$$

$$C_4 + C_3 + C_1 = 1$$

$$C_7 + C_6 + C_1 = 1$$

There are 256 9-bit codewords satisfying the above constraints, which are provided in a hexadecimal form as shown in Table 1. 256 9-bit codewords satisfying the above constraints can be mapped on a one to one basis into the first 8-bit group A ($2^8$) one by one.

TABLE 1

| 1FF | 1B2 | 155 | 0EF | 09B | 18E |
| 1FW | 1AD | 14A | 0F7 | 09A | 18D |

TABLE 1-continued

| 1FD | 16D | 153 | 0F6 | 099 | 0C9 |
| 1CF | 19F | 152 | 0F5 | 0E6 | 18B |
| 1FB | 19E | 1AA | 04F | 097 | 18A |
| 1FA | 19D | 16A | 0F3 | 096 | 189 |
| 1F9 | 1C6 | 13F | 0F2 | 095 | 0E9 |
| 1EF | 19B | 13E | 0AF | 046 | 1E7 |
| 1F7 | 19A | 12F | 06F | 093 | 1C7 |
| 1F6 | 199 | 1C9 | 0DF | 092 | 1A7 |
| 1F5 | 1E6 | 13B | 0DE | 0A6 | 049 |
| 14F | 197 | 13A | 0DD | 066 | 167 |
| 1F3 | 196 | 12B | 0CE | 07F | 147 |
| 1F2 | 195 | 1E9 | 0DB | 07E | 0A9 |
| 1AF | 146 | 137 | 0DA | 07D | 069 |
| 16F | 193 | 136 | 0D9 | 0CB | 08F |
| 1DF | 192 | 127 | 0EE | 07B | 08E |
| 1DE | 1A6 | 149 | 0D7 | 07A | 08D |
| 1DD | 166 | 133 | 0D6 | 079 | 0C5 |
| 1CE | 17F | 132 | 0D5 | 0EB | 08B |
| 1DB | 17E | 1A9 | 04E | 077 | 08A |
| 1DA | 17D | 169 | 0D3 | 076 | 089 |
| 1D9 | 1CB | 11F | 0D2 | 075 | 0E5 |
| 1EE | 17B | 11E | 0AE | 04B | 0E7 |
| 1D7 | 17A | 12E | 06E | 073 | 0C7 |
| 1D6 | 179 | 1C5 | 0BF | 072 | 0A7 |
| 1D5 | 1EB | 11B | 0BE | 0AB | 045 |
| 14E | 177 | 11A | 0BD | 06B | 067 |
| 1D3 | 176 | 12A | 0CD | 05F | 047 |
| 1D2 | 175 | 1E5 | 0BB | 05E | 0A5 |
| 1AE | 14B | 117 | 0BA | 05D | 065 |
| 16E | 173 | 116 | 0B9 | 0CA | |
| 1BF | 172 | 126 | 0ED | 05B | |
| 1BE | 1AB | 145 | 0B7 | 05A | |
| 1BD | 16B | 113 | 0B6 | 059 | |
| 1CD | 15F | 112 | 0B5 | 0EA | |
| 1BB | 15E | 1A5 | 04D | 057 | |
| 1BA | 15D | 165 | 0B3 | 056 | |
| 1B9 | 1CA | 0FF | 0B2 | 055 | |
| 1ED | 15B | 0FE | 0AD | 04A | |
| 1B7 | 15A | 0FD | 06D | 053 | |
| 1B6 | 159 | 0CF | 09F | 052 | |
| 1B5 | 1EA | 0FB | 09E | 0AA | |
| 14D | 157 | 0FA | 09D | 06A | |
| 1B3 | 156 | 0F9 | 0C6 | 18F | |

Table 2 is a lookup table used to implement the 16/17 RLL(0,6/6) codeword, where the input-output relationship of the 8/9 RLL code is expressed as a hexadecimal number. In Table 2, "LS" represents the least significant digit, and "MS" represents the most significant digit. 250 codewords of Table 2 can be divided into six partition groups in order to simplify the Boolean logic equations. Here, capital letters G, H, J, K, L and M represent six partition groups, respectively.

TABLE 2

| | LS | | | | | | | | | | | | | | | |
|---|---|---|---|---|---|---|---|---|---|---|---|---|---|---|---|---|
| MS | 0 | 1 | 2 | 3 | 4 | 5 | 6 | 7 | 8 | 9 | A | B | C | D | E | F |
| 0 | 065 | 0A5 | 047 | 067 | 045 | 0A7 | 0C7 | 0E7 | 0E5 | 089 | 08A | 08B | 0C5 | 08D | 08E | 08F |
| 1 | 069 | 0A9 | 147 | 167 | 049 | 1A7 | 1C7 | 1E7 | 0E9 | 189 | 18A | 1BB | 0C9 | 0BD | 18E | 18F |
| 2 | 06A | 0AA | 052 | 053 | 04A | 055 | 056 | 057 | 0EA | 059 | 05A | 05B | 0CA | 05D | 05E | 05F |
| 3 | 06B | 0A5 | 072 | 073 | 04B | 075 | 076 | 077 | 0EB | 079 | 07A | 07B | 0CB | 07D | 07F | 07F |
| 4 | 066 | 0A6 | 092 | 093 | 046 | 095 | 096 | 097 | 0E6 | 099 | 09A | 09B | 0C6 | 09D | 09E | 09F |
| 5 | 06D | 0AD | 0B2 | 0B3 | 04D | 0B5 | 0B6 | 0B7 | 0ED | 0B9 | 0BA | 0BB | 0CD | 0BD | 0BE | 0BF |
| 6 | 06E | 0AE | 0D2 | 0D3 | 04E | 0D5 | 0D6 | 0D7 | 0EE | 0D9 | 0DA | 0DB | 0CE | 0DD | 0DE | 0DF |
| 7 | 06F | 0AF | 0F2 | 0F3 | 04F | 0F5 | 0F6 | 0F7 | 0EF | 0F9 | 0FA | 0FB | 0CF | 0FD | 0FE | 0FF |
| 8 | 165 | 1A5 | 112 | 113 | 145 | 126 | 116 | 117 | 1E5 | 12A | 11A | 11B | 1C5 | 12E | 11E | 11F |
| 9 | 169 | 1A9 | 132 | 133 | 139 | 127 | 136 | 137 | 1E9 | 12B | 13A | 13B | 1C9 | 12F | 13E | 13F |
| A | 16A | 1AA | 152 | 153 | 14A | 155 | 156 | 157 | 1EA | 159 | 15A | 15B | 1CA | 15D | 15E | 15F |

TABLE 2-continued

| MS | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| B | 16B | 1AB | 172 | 173 | 14B | 175 | 176 | 177 | 1EB | 179 | 17A | 17B | 1CB | 17D | 17E | 17F |
| C | 166 | 1A6 | 192 | 193 | 146 | 195 | 196 | 197 | 1E6 | 199 | 19A | 19B | 1C6 | 19D | 19E | 19F |
| D | 16D | 1AD | 1B2 | 1B3 | 14D | 1B5 | 1B6 | 1B7 | 1ED | 1B9 | 1BA | 1BB | 1CD | 1BD | 1BE | 1BF |
| E | 16E | 1AE | 1D2 | 1D3 | 14E | 1D5 | 1D6 | 1D7 | 1EE | 1D9 | 1DA | 1DB | 1CE | 1DD | 1DE | 1DF |
| F | 16F | 1AF | 1F2 | 1F3 | 14F | 1F5 | 1F6 | 1F7 | 1EF | 1F9 | 1FA | 1FB | 1CF | 1FD | 1FE | 1FF |

In a case of the first partition G, the first 4 bits and the last 4 bits of the first 8-bit group A are mapped into the first 4 bits and the last 4 bits of the 9-bit codeword C without any changes. Also, the middle bit, that is, the fifth bit of the codeword C is always "1". 148 9-bit codewords C belong to the partition G, which is as follows.

$$G=(A_6+A_5)\cdot((A_1+A_0)\cdot(A_3+\bar{A}_3\cdot A_2)+\bar{A}_3\cdot\bar{A}_2\cdot A_1)+A_7\cdot\bar{A}_6\cdot\bar{A}_5\cdot A_1$$

The second partition H includes 48 9-bit codewords, which is as follows.

$$H=\bar{A}_2\cdot\bar{A}_1\cdot(\bar{A}_3+A_3\cdot\bar{A}_0)$$

The third partition J includes 32 9-bit codewords, which is as follows.

$$J=A_2\cdot\bar{A}_1\cdot\bar{A}_0$$

The fourth partition K includes 32 9-bit codewords, which is as follows.

$$K=\bar{A}_7\cdot\bar{A}_6\cdot\bar{A}_5\cdot(\bar{A}_3\cdot\bar{A}_2\cdot A_1+\bar{A}_3\cdot A_2\cdot(A_1+A_0))$$

The fifth partition L includes 32 9-bit codewords, which is as follows.

$$L=\bar{A}_7\cdot\bar{A}_6\cdot\bar{A}_5\cdot A_3\cdot(A_1+A_0)$$

The sixth partition M includes 32 9-bit codewords, which is as follows.

$$M=A_7\cdot\bar{A}_6\cdot\bar{A}_5\cdot(A_3\cdot\bar{A}_2\cdot A_2)\cdot\bar{A}_1\cdot A_0$$

The Boolean logic equation of the 8/9 RLL encoder 42 for encoding $A_7{\sim}A_0$ data bits into $C_8{\sim}C_0$ codewords can be simplified by the six partitions of Table 2. The equation of the 8/9 RLL encoder 42, which is simplified by the six partitions G, H, J, K, L and M, is as follows.

$$C_8=G\cdot A_7+H\cdot A_7+J\cdot A_7+K\cdot A_4+L\cdot A_4+M$$

$$C_7=G\cdot A_6+H\cdot(A_3+A_0)+J\cdot A_3+K\cdot A_3+K\cdot A_2+L$$

$$C_6=G\cdot A_5+H\cdot\bar{A}_1\cdot\bar{A}_0+J+K\cdot A_1$$

$$C_5=G\cdot A_4+H+K\cdot A_0+M$$

$$C_4=G$$

$$C_3=G\cdot A_3+H\cdot(A_5+A_4)+J\cdot(A_5+A_4)+L+M\cdot A_2$$

$$C_2=G\cdot A_2+H\cdot(\bar{A}_5\cdot\bar{A}_4+A_6)+J\cdot(\bar{A}_5\cdot\bar{A}_4+A_6)+K+L\cdot A_2+M\cdot A_2$$

$$C_1=G\cdot A_1+H\cdot(A_5+A_6\cdot\bar{A}_5\cdot\bar{A}_4)+J\cdot(A_5+A_6\cdot\bar{A}_5\cdot\bar{A}_4)+K+L\cdot A_1+M$$

$$C_0=G\cdot A_0+H\cdot(A_4+\bar{A}_6\cdot\bar{A}_5)+J\cdot(A_4+\bar{A}_6\cdot\bar{A}_5)+K+L\cdot A_0+M\cdot A_4$$

Also, the Boolean logic equation of the 9/8 RLL decoder 54 can be expressed in a similar manner as the above, using six partitions G, H, J, K, L and M as follows. Each partition can be represented by codewords $C_8{\sim}C_0$, respectively.

$$G=C_4$$

$$H=C_5\cdot\bar{C}_4\cdot(C_7+C_6)\cdot(C_3+C_2)\cdot(C_1+C_0)\cdot(C_3+\bar{C}_3\cdot(\overline{C_1}+\bar{C}_0))$$

$$J=C_6\cdot\bar{C}_5\cdot\bar{C}_4\cdot(C_3+C_2)\cdot(C_1+C_0)\cdot(C_3+\bar{C}_3\cdot(\overline{C_1}+\bar{C}_0))$$

$$K=\bar{C}_4\cdot\bar{C}_3\cdot\bar{C}_2\cdot\bar{C}_1\cdot\bar{C}_0\cdot(C_6+C_5)\cdot(C_7+C_6)$$

$$L=C_7\cdot\bar{C}_6\overline{C}_5\cdot\bar{C}_4\cdot\bar{C}_3\cdot(C_1+C_0)$$

$$M=C_8\cdot\bar{C}_7\cdot\bar{C}_6\cdot C5\cdot\bar{C}_4\cdot(C_3+C_2)\cdot C_1$$

The Boolean logic equation of the 9/8 RLL decoder 54 for decoding 9-bit codewords $C_8{\sim}C_0$ into 8-bit data $A_7{\sim}A_0$ can be simplified by the six partitions G, H, J, K, L and M of Table 2, as follows.

$$A_7=G\cdot C_8+H\cdot C_8+J\cdot C_8+M$$

$$A_6=G\cdot C_7+H\cdot C_2\cdot(C_3+C_1)+J\cdot C_2\cdot(C_3+C_1)$$

$$A_5=G\cdot C_6+H\cdot C_1\cdot(C_3+C_0)+J\cdot C_1\cdot C_3$$

$$A_4=G\cdot C_5+H\cdot C_0\cdot(C_3+C_1)+J\cdot C_0\cdot C_3+K\cdot C_8+M\cdot C_0$$

$$A_3=G\cdot C_3+H\cdot C_7\cdot C_6+J\cdot C_7+L+M\cdot C_3$$

$$A_2=G\cdot C_2+J+K\cdot C_7+L\cdot C_2+M\cdot C_2$$

$$A_1=G\cdot C_1+K\cdot C_6+L\cdot C_1$$

$$A_0=G\cdot C_0+H\cdot\bar{C}_6+K\cdot C_5+L\cdot C_0+M$$

In the method for mapping 8-bit data bits $A_7{\sim}A_0$ into 9-bit codewords $C_8{\sim}C_0$ based on the codewords of Table 1, the logic equations of the 8/9 RLL encoder and 9/8 RLL decoder can be simplified by various methods. That is, a mapping logic equation which is different from the input/output mapping of the present invention may be used, and a logic gate circuit may be implemented at an optimum level based on the given logic equation of the present invention.

As described above, the coding/decoding method of the present invention is simpler than the conventional rate 16/17 RLL(0,6/6) coding/decoding method, by adopting an encoder/decoder having a straightforward and efficient structure. Thus, the size of the hardware can be reduced. Also, the present invention provides an optimal lookup table between input and output, for encoding/decoding the rate 16/17 RLL(0,6/6) block code, and a simplified relational equation between input and output.

Korean Patent Application No. 97-51446 is incorporated herein by reference.

It will be understood that various modifications in the form of the invention as described herein and its preferred embodiments may be made without departing from the spirit thereof and of the scope of the claims which follow.

What is claimed is:

1. A coding method for encoding a binary data symbol $X_k$ (k=1, 2, 3, . . . ) having a first predetermined number of bits (k), received from a storage device or a communications channel, into a codeword $Y_l$ (l=1, 2, 3, . . . ) having a second predetermined number of bits (l), the coding method comprising the steps of:

(a) dividing the binary data symbol $X_k$ into a first group having one of odd bits or even bits, and a second group having the other of odd bits or even bits;

(b) mapping the first group into a codeword from the following table:

| LS MS | 0 | 1 | 2 | 3 | 4 | 5 | 6 | 7 |
|---|---|---|---|---|---|---|---|---|
| 0 | 065 | 0A5 | 047 | 067 | 045 | 0A7 | 0C7 | 0E7 |
| 1 | 069 | 0A9 | 147 | 167 | 049 | 1A7 | 1C7 | 1E7 |
| 2 | 06A | 0AA | 052 | 053 | 04A | 055 | 056 | 057 |
| 3 | 06B | 0AB | 072 | 073 | 04B | 075 | 076 | 077 |
| 4 | 066 | 0A6 | 092 | 093 | 046 | 095 | 096 | 097 |
| 5 | 06D | 0AD | 0B2 | 0B3 | 04D | 0B5 | 0B6 | 0B7 |
| 6 | 06E | 0AE | 0D2 | 0D3 | 04E | 0D5 | 0D6 | 0D7 |
| 7 | 06F | 0AF | 0F2 | 0F3 | 04F | 0F5 | 0F6 | 0F7 |
| 8 | 165 | 1A5 | 112 | 113 | 145 | 126 | 116 | 117 |
| 9 | 169 | 1A9 | 132 | 133 | 139 | 127 | 136 | 137 |
| A | 16A | 1AA | 152 | 153 | 14A | 155 | 156 | 157 |
| B | 16B | 1AB | 172 | 173 | 14B | 175 | 176 | 177 |
| C | 166 | 1A6 | 192 | 193 | 146 | 195 | 196 | 197 |
| D | 16D | 1AD | 1B2 | 1B3 | 14D | 1B5 | 1B6 | 1B7 |
| E | 16E | 1AE | 1D2 | 1D3 | 14E | 1D5 | 1D6 | 1D7 |
| F | 16F | 1AF | 1F2 | 1F3 | 14F | 1F5 | 1F6 | 1F7 |

-continued

| LS MS | 8 | 9 | A | B | C | D | E | F |
|---|---|---|---|---|---|---|---|---|
| 0 | 0E5 | 089 | 08A | 08B | 0C5 | 08D | 08E | 08F |
| 1 | 0E9 | 189 | 18A | 18B | 0C9 | 18D | 18E | 18F |
| 2 | 0EA | 059 | 05A | 05B | 0CA | 05D | 05E | 05F |
| 3 | 0EB | 079 | 07A | 07B | 0CB | 07D | 07E | 07F |
| 4 | 0E6 | 099 | 09A | 09B | 0C6 | 09D | 09E | 09F |
| 5 | 0ED | 0B9 | 0BA | 0BB | 0CD | 0BD | 0BE | 0BF |
| 6 | 0EE | 0D9 | 0DA | 0DB | 0CE | 0DD | 0DE | 0DF |
| 7 | 0EF | 0F9 | 0FA | 0FB | 0CF | 0FD | 0FE | 0FF |
| 8 | 1E5 | 12A | 11A | 11B | 1C5 | 12E | 11E | 11F |
| 9 | 1E9 | 12B | 13A | 13B | 1C9 | 12F | 13E | 13F |
| A | 1EA | 159 | 15A | 15B | 1CA | 15D | 15E | 15F |
| B | 1EB | 179 | 17A | 17B | 1CB | 17D | 17E | 17F |
| C | 1E6 | 199 | 19A | 19B | 1C6 | 19D | 19E | 19F |
| D | 1ED | 1B9 | 1BA | 1BB | 1CD | 1BD | 1BE | 1BF |
| E | 1EE | 1D9 | 1DA | 1DB | 1CE | 1DD | 1DE | 1DF |
| F | 1EF | 1F9 | 1FA | 1FB | 1CF | 1FD | 1FE | 1FF | where LS represents a least significant digit, and MS represents a most significant digit of the first group; and (c) interleaving the second group with the mapped codeword, and outputting a result as the codeword $Y_l$.

2. The coding method of claim 1, wherein a code ratio between the binary data symbol $X_k$ (k=1, 2, 3, . . . ) and the codeword $Y_l$ (l=1, 2, 3, . . . ) is 16/17.

3. The coding method of claim 2, wherein the mapped codeword and the second group have a same maximum run length of 6.

4. The coding method of claim 2, wherein 8/9 RLL encoding is used to generate the codeword table.

5. The coding method of claim 1, wherein the mapped codeword and the second group have a same maximum run length of 6.

6. A decoding method for decoding a codeword $Y_l$ (l=1, 2, 3, . . . ) having a predetermined number of bits (l) from the following table:

| LS MS | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 065 | 0A5 | 047 | 067 | 045 | 0A7 | 0C7 | 0E7 | 0E5 | 089 | 08A | 08B | 0C5 | 08D | 08E | 08F |
| 1 | 069 | 0A9 | 147 | 167 | 049 | 1A7 | 1C7 | 1E7 | 0E9 | 189 | 18A | 18B | 0C9 | 18D | 18E | 18F |
| 2 | 06A | 0AA | 052 | 053 | 04A | 055 | 056 | 057 | 0EA | 059 | 05A | 05B | 0CA | 05D | 05E | 05F |
| 3 | 06B | 0AB | 072 | 073 | 04B | 075 | 076 | 077 | 0EB | 079 | 07A | 07B | 0CB | 07D | 07E | 07F |
| 4 | 066 | 0A6 | 092 | 093 | 046 | 095 | 096 | 097 | 0E6 | 099 | 09A | 09B | 0C6 | 09D | 09E | 09F |
| 5 | 06D | 0AD | 0B2 | 0B3 | 04D | 0B5 | 0B6 | 0B7 | 0ED | 0B9 | 0BA | 0BB | 0CD | 0BD | 0BE | 0BF |
| 6 | 06E | 0AE | 0D2 | 0D3 | 04E | 0D5 | 0D6 | 0D7 | 0EE | 0D9 | 0DA | 0DB | 0CE | 0DD | 0DE | 0DF |
| 7 | 06F | 0AF | 0F2 | 0F3 | 04F | 0F5 | 0F6 | 0F7 | 0EF | 0F9 | 0FA | 0FB | 0CF | 0FD | 0FE | 0FF |
| 8 | 165 | 1A5 | 112 | 113 | 145 | 126 | 116 | 117 | 1E5 | 12A | 11A | 11B | 1C5 | 12E | 11E | 11F |
| 9 | 169 | 1A9 | 132 | 133 | 139 | 127 | 136 | 137 | 1E9 | 12B | 13A | 13B | 1C9 | 12F | 13E | 13F |
| A | 16A | 1AA | 152 | 153 | 14A | 155 | 156 | 157 | 1EA | 159 | 15A | 15B | 1CA | 15D | 15E | 15F |
| B | 16B | 1AB | 172 | 173 | 14B | 175 | 176 | 177 | 1EB | 179 | 17A | 17B | 1CB | 17D | 17E | 17F |
| C | 166 | 1A6 | 192 | 193 | 146 | 195 | 196 | 197 | 1E6 | 199 | 19A | 19B | 1C6 | 19D | 19E | 19F |
| D | 16D | 1AD | 1B2 | 1B3 | 14D | 1B5 | 1B6 | 1B7 | 1ED | 1B9 | 1BA | 1BB | 1CD | 1BD | 1BE | 1BF |
| E | 16E | 1AE | 1D2 | 1D3 | 14E | 1D5 | 1D6 | 1D7 | 1EE | 1D9 | 1DA | 1DB | 1CE | 1DD | 1DE | 1DF |
| F | 16F | 1AF | 1F2 | 1F3 | 14F | 1F5 | 1F6 | 1F7 | 1EF | 1F9 | 1FA | 1FB | 1CF | 1FD | 1FE | 1FF | where LS represents a least significant digit, and MS represents a most significant digit of the first group, received from a storage device or a communications channel, into a binary data symbol $X_k$ (k=1, 2, 3, . . . ) having a first predetermined number of bits (k), the decoding method comprising the steps of:

(a) dividing the codeword $Y_l$ into a codeword having one of odd bits or even bits, and a second group having the other of odd bits or even bits;

(b) decoding the codeword into a first group having a second predetermined number of bits; and (c) interleaving the second group with the first group, and outputting a result as the binary data symbol $X_k$.

7. The decoding method of claim 6, wherein 8/9 RLL decoding is used to generate the codeword table.

8. A coding/decoding system comprising:

an RRL modulation encoder configured to divide a binary symbol sequence into a first group of bits and a second group of bits, to map the first group into a codeword from the following table:

| MS\LS | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 065 | 0A5 | 047 | 067 | 045 | 0A7 | 0C7 | 0E7 | 0E5 | 089 | 08A | 08B | 0C5 | 08D | 08E | 08F |
| 1 | 069 | 0A9 | 147 | 167 | 049 | 1A7 | 1C7 | 1E7 | 0E9 | 189 | 18A | 18B | 0C9 | 18D | 18E | 18F |
| 2 | 06A | 0AA | 052 | 053 | 04A | 055 | 056 | 057 | 0EA | 059 | 05A | 05B | 0CA | 05D | 05E | 05F |
| 3 | 06B | 0AB | 072 | 073 | 04B | 075 | 076 | 077 | 0EB | 079 | 07A | 07B | 0CB | 07D | 07E | 07F |
| 4 | 066 | 0A6 | 092 | 093 | 046 | 095 | 096 | 097 | 0E6 | 099 | 09A | 09B | 0C6 | 09D | 09E | 09F |
| 5 | 06D | 0AD | 0B2 | 0B3 | 04D | 0B5 | 0B6 | 0B7 | 0ED | 0B9 | 0BA | 0BB | 0CD | 0BD | 0BE | 0BF |
| 6 | 06E | 0AE | 0D2 | 0D3 | 04E | 0D5 | 0D6 | 0D7 | 0EE | 0D9 | 0DA | 0DB | 0CE | 0DD | 0DE | 0DF |
| 7 | 06F | 0AF | 0F2 | 0F3 | 04F | 0F5 | 0F6 | 0F7 | 0EF | 0F9 | 0FA | 0FB | 0CF | 0FD | 0FE | 0FF |
| 8 | 165 | 1A5 | 112 | 113 | 145 | 126 | 116 | 117 | 1E5 | 12A | 11A | 11B | 1C5 | 12E | 11E | 11F |
| 9 | 169 | 1A9 | 132 | 133 | 139 | 127 | 136 | 137 | 1E9 | 12B | 13A | 13B | 1C9 | 12F | 13E | 13F |
| A | 16A | 1AA | 152 | 153 | 14A | 155 | 156 | 157 | 1EA | 159 | 15A | 15B | 1CA | 15D | 15E | 15F |
| B | 16B | 1AB | 172 | 173 | 14B | 175 | 176 | 177 | 1EB | 179 | 17A | 17B | 1CB | 17D | 17E | 17F |
| C | 166 | 1A6 | 192 | 193 | 146 | 195 | 196 | 197 | 1E6 | 199 | 19A | 19B | 1C6 | 19D | 19E | 19F |
| D | 16D | 1AD | 1B2 | 1B3 | 14D | 1B5 | 1B6 | 1B7 | 1ED | 1B9 | 1BA | 1BB | 1CD | 1BD | 1BE | 1BF |
| E | 16E | 1AE | 1D2 | 1D3 | 14E | 1D5 | 1D6 | 1D7 | 1EE | 1D9 | 1DA | 1DB | 1CE | 1DD | 1DE | 1DF |
| F | 16F | 1AF | 1F2 | 1F3 | 14F | 1F5 | 1F6 | 1F7 | 1EF | 1F9 | 1FA | 1FB | 1CF | 1FD | 1FE | 1FF | where LS represents a least significant digit, and MS represents a most significant digit of the first group, and to interleave the second group with the codeword in a predetermined manner so as to produce an output signal;

an output medium, connected to said RLL modulation encoder, configured to store the output signal; and an RLL modulation decoder, connected to said output medium, configured to divide the output signal into the codeword and the second group, to decode the codeword into the first group, and to interleave the first group and the second group so as to obtain the binary symbol sequence.

9. A coding system according to claim 8, further comprising a precoder attached between said RLL modulation encoder and said output medium.

10. A coding system according to claim 8, further comprising a equalizer and a sequence detector connected in series between said output medium and said RLL modulation decoder.

11. A method for encoding a binary data sequence $X_k$ (k=0, 1, 2, . . . , 15) having a series of a predetermined numbers of bits (k) and received from a storage device or a communications channel, into a codeword $Y_l$ (l=0, 1, 2, . . . , 16) having a predetermined number of bits (l), comprising the steps of:

(a) dividing the bits (k) of the binary data sequence $X_k$ into a first group and a second group of bits;

(b) encoding the first group of bits with a sub-encoder to a sub-codeword having a predetermined number of bits;

(c) bypassing the second group of bits; and (d) interleaving the sub-codeword with the bypassed second group of bits, and outputting a codeword $Y_l$.

12. The coding method of claim 11, wherein, the encoding of step b is performed using the following table:

| MS\LS | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 065 | 0A5 | 047 | 067 | 045 | 0A7 | 0C7 | 0E7 | 0E5 | 089 | 08A | 08B | 0C5 | 08D | 08E | 08F |
| 1 | 069 | 0A9 | 147 | 167 | 049 | 1A7 | 1C7 | 1E7 | 0E9 | 189 | 15A | 18B | 0C9 | 16D | 18E | 18F |
| 2 | 06A | 0AA | 052 | 053 | 04A | 055 | 056 | 057 | 0EA | 059 | 05A | 05B | 0GA | 05D | 05E | 05F |
| 3 | 06B | 0AB | 072 | 073 | 04B | 075 | 076 | 077 | 0EB | 079 | 07A | 07B | 0CB | 07D | 07E | 07F |
| 4 | 086 | 0AB | 092 | 093 | 046 | 095 | 096 | 097 | 0E6 | 099 | 09A | 09B | 0C6 | 09D | 09E | 09F |
| 5 | 0BD | 0AD | 0B2 | 0B3 | 04D | 0B5 | 0B6 | 0B7 | 0ED | 0B9 | 0BA | 0BB | 0CD | 0BD | 0BE | 0BF |
| 6 | 06E | 0AE | 0D2 | 0D3 | 04E | 0D5 | 0D6 | 0D7 | 0EE | 0D9 | 0DA | 0DB | 0CE | 0DD | 0DE | 0DF |
| 7 | 06F | 0AF | 0F2 | 0F3 | 04F | 0F5 | 0F6 | 0F7 | 0EF | 0F9 | 0FA | 0FB | 0CF | 0FD | 0FE | 0FF |
| 8 | 165 | 1A5 | 112 | 113 | 145 | 126 | 116 | 117 | 1E5 | 12A | 11A | 11B | 1C5 | 12E | 11E | 11F |
| 9 | 169 | 1A9 | 132 | 133 | 139 | 127 | 136 | 137 | 1E9 | 12B | 13A | 13B | 1C9 | 12F | 13E | 13F |
| A | 16A | 1AA | 152 | 153 | 14A | 155 | 156 | 157 | 1EA | 159 | 15A | 15B | 1CA | 15D | 15E | 15F |
| B | 16B | 1AB | 172 | 173 | 14B | 175 | 176 | 177 | 1EB | 179 | 17A | 17B | 1CB | 17D | 17E | 17F |
| C | 166 | 1A6 | 192 | 193 | 146 | 195 | 196 | 197 | 1E6 | 199 | 19A | 19B | 1C6 | 19D | 19E | 19F |
| D | 16D | 1AD | 1B2 | 1B3 | 14D | 1B5 | 1B6 | 1B7 | 1ED | 1B9 | 1BA | 1BB | 1CD | 1BD | 1BE | 1BF |
| E | 16E | 1AE | 1D2 | 103 | 14E | 1D5 | 1D6 | 1D7 | 1EE | 1D9 | 1DA | 1DB | 1CE | 1DD | 1DE | 1DF |
| F | 16F | 1AF | 1F2 | 1F3 | 14F | 1F5 | 1F6 | 1F7 | 1EF | 1F9 | 1FA | 1FB | 1CF | 1FD | 1FE | 1FF |

13. The coding method of claim 4, wherein the sub-codeword satisfies the following conditions:

$$C_8+C_7+C_6=1,$$

$$C_1+C_0=1,$$

$$C_7+C_6+C_5+C_4=1,$$

$$C_6+C_5+C_4+C_3=1,$$

$$C_3+C_2+C_1=1,$$

$$C_4+C_3+C_1=1, \text{ and}$$

$$C_7+C_6+C_1=1.$$

14. The coding method of claim 11, wherein the encoding of step b is performed by mapping the first group of bits to the sub-codeword using the following table:

| | | | | | | | | | LS | | | | | | | |
|---|---|---|---|---|---|---|---|---|---|---|---|---|---|---|---|---|
| MS | 0 | 1 | 2 | 3 | 4 | 5 | 6 | 7 | 8 | 9 | A | B | C | D | E | F |
| 0 | 065 | 0A5 | 047 | 067 | 045 | 0A7 | 0C7 | 0E7 | 0E5 | 089 | 08A | 08B | 0C5 | 08D | 08E | 08F |
| 1 | 069 | 0A9 | 147 | 167 | 049 | 1A7 | 1C7 | 1E7 | 0E9 | 189 | 18A | 1BB | 0C9 | 1BD | 18E | 18F |
| 2 | 06A | 0AA | 052 | 053 | 04A | 055 | 056 | 057 | 0EA | 059 | 05A | 05B | 0CA | 050 | 05E | 05F |
| 3 | 06B | 0AB | 072 | 073 | 04B | 075 | 076 | 377 | 0EB | 079 | 07A | 07B | 0CB | 07D | 07E | 07F |
| 4 | 066 | 0A6 | 092 | 093 | 046 | 095 | 096 | 097 | 0E6 | 099 | 09A | 09B | 0C6 | 09D | 09E | 09F |
| 5 | 060 | 0AD | 0B2 | 0B3 | 040 | 0B5 | 0B6 | 0B7 | 0ED | 0B9 | 0BA | 0BB | 0CD | 0BD | 0BE | 0BF |
| 6 | 06E | 0AE | 0D2 | 0D3 | 04E | 0D5 | 0D5 | 0D7 | 0EE | 0D9 | 0DA | 0DB | 0CE | 0DD | 0DE | 0DF |
| 7 | 06F | 0AF | 0F2 | 0F3 | 04F | 0F5 | 0F6 | 0F7 | 0EF | 0F9 | 0FA | 0FB | GCF | 0FD | 0FE | GFF |
| 8 | 165 | 1A5 | 112 | 113 | 145 | 126 | 115 | 117 | 1E5 | 12A | 11A | 11B | 1C5 | 12E | 11E | 11F |
| 9 | 169 | 1A9 | 132 | 133 | 139 | 127 | 136 | 137 | 1E9 | 12B | 13A | 13B | 1C9 | 12F | 13E | 13F |
| A | 16A | 1AA | 152 | 153 | 14A | 155 | 156 | 157 | 1EA | 159 | 15A | 15B | 1CA | 15D | 15E | 15F |
| B | 16B | 1AB | 172 | 173 | 14B | 175 | 176 | 177 | 1EB | 179 | 17A | 17B | 1CB | 17D | 17E | 17F |
| C | 166 | 1A6 | 192 | 193 | 146 | 195 | 196 | 197 | 1E6 | 199 | 19B | 1C6 | 19D | 19E | 19F |
| D | 16D | 1AD | 1B2 | 1B3 | 14D | 1B5 | 166 | 1B7 | 1ED | 1B9 | 1BA | 1BB | 1CD | 1BD | 1BE | 1BF |
| E | 16E | 1AE | 1D2 | 1D3 | 14E | 1D5 | 1D6 | 1D7 | 1EE | 1D9 | 1DA | 1DB | 1CE | 1DD | 1DE | 1DF |
| F | 16F | 1AF | 1F2 | 1F3 | 14F | 1F5 | 1F6 | 1F7 | 1EF | 1F9 | 1FA | 1FB | 1CF | 1FD | 1FE | 1FF |

15. The coding method of claim 11, wherein, the second group of bits is a sequence B ($B_7$, $B_6$, . . . , $B_0$) and a sequence W of the codeword $Y_l$ satifies the following condition:

$$W=[C_8,B_7,C_7,B_6,C_6,C_5,B_5,C_4,B_4,C_3,B_3,C_2,B_2,B_1,C_1,B_0,C_0].$$

16. The coding method of claim 11, wherein the sub-codeword is selected from the following table:

| | | | | | |
|---|---|---|---|---|---|
| 1FF | 1B2 | 155 | 0EF | 09B | 18E |
| 1FD | 16D | 153 | 0F6 | 099 | 0C9 |
| 1CF | 19F | 152 | 0F5 | 0E6 | 18B |
| 1FB | 19E | 1AA | 04F | 097 | 18A |
| 1FA | 19D | 16A | 0F3 | 096 | 189 |
| 1F9 | 1C6 | 13F | 0F2 | 095 | 0E9 |
| 1EF | 19B | 13E | 0AF | 046 | 1E7 |
| 1F7 | 19A | 12F | 06F | 093 | 1C7 |
| 1F6 | 199 | 1C9 | 0DF | 092 | 1A7 |
| 1F5 | 1E6 | 13B | 0DE | 0A6 | 049 |
| 14F | 197 | 13A | 0DD | 066 | 167 |
| 1F3 | 196 | 12B | 0CE | 07F | 147 |
| 1F2 | 195 | 1E9 | 0DB | 07E | 0A9 |
| 1AF | 146 | 137 | 0DA | 07D | 069 |
| 16F | 193 | 136 | 0D9 | 0CB | 08F |
| 1DF | 192 | 127 | 0EE | 07B | 08E |
| 1DE | 1A6 | 149 | 0D7 | 07A | 08D |
| 1DD | 166 | 133 | 0D6 | 079 | 0C5 |
| 1CE | 17F | 132 | 0D5 | 0EB | 08B |
| 1DB | 17E | 1A9 | 04E | 077 | 08A |
| 1DA | 17D | 169 | 0D3 | 076 | 089 |
| 1D9 | 1CB | 11F | 0D2 | 075 | 0E5 |
| 1EE | 17B | 11E | 0AE | 04B | 0E7 |
| 1D7 | 17A | 12E | 06E | 073 | 0C7 |
| 1D6 | 179 | 1C5 | 0BF | 072 | 0A7 |
| 1D5 | 1EB | 11B | 0BE | 0AB | 045 |
| 14E | 177 | 11A | 0BD | 06B | 067 |
| 1D3 | 176 | 12A | 0CD | 05F | 047 |
| 1D2 | 175 | 1E5 | 0BB | 05E | 0A5 |
| 1AE | 14B | 117 | 0BA | 05D | 065 |
| 16E | 173 | 116 | 0B9 | 0CA | |
| 1BF | 172 | 126 | 0ED | 05B | |
| 1BE | 1AB | 145 | 0B7 | 05A | |
| 1BD | 16B | 113 | 0B6 | 059 | |
| 1CD | 15F | 112 | 0B5 | 0EA | |
| 1BB | 15E | 1A5 | 04D | 057 | |
| 1BA | 15D | 165 | 0B3 | 016 | |
| 1B9 | 1CA | 0FF | 0B2 | 055 | |
| 1ED | 15B | 0FE | 0AD | 04A | |
| 1B7 | 15A | 0FD | 06D | 053 | |
| 1B6 | 159 | 0CF | 09F | 052 | |
| 1B5 | 1EA | 0FB | 09E | 0AA | |
| 14D | 157 | 0FA | 09D | 06A | |
| 1B3 | 156 | 0F9 | 0C6 | 18F | |

17. A method for decoding a codeword $Y_l$ (l=0, 1, 2, . . . , 16) having a predetermined number of bits (l) and received from a storage device or a communications channel into a binary data sequence $X_k$ (k=0, 1, 2, . . . , 15) having a series of predetermined numbers of bits (k) comprising the steps of:

(a) dividing the codeword $Y_l$ having a predetermined number of bits (l) into a first group and a second group of bits;

(b) decoding the first group of bits by a sub-decoder of a predetermined number of bits;

(c) bypassing the second group of bits; and (d) interleaving the first group of bits decoded by the sub-decoder in step b with the bypassed the second group of bits, and outputting the resulting binary data sequence $X_k$ having a predetermined number of bits (k).

18. The decoding method of claim 17, wherein the decoding of step b is performed using the following table:

| MS | \|   | \|   | \|   | \|   | \|   | \|   | LS  | \|   | \|   | \|   | \|   | \|   | \|   | \|   | \|   |
|----|-----|-----|-----|-----|-----|-----|-----|-----|-----|-----|-----|-----|-----|-----|-----|-----|
|    | 0   | 1   | 2   | 3   | 4   | 5   | 6   | 7   | 8   | 9   | A   | B   | C   | D   | E   | F   |
| 0  | 065 | 0A5 | 047 | 067 | 045 | 0A7 | 0C7 | 0E7 | 0E5 | 089 | 08A | 08B | 0C5 | 08D | 08E | 08F |
| 1  | 069 | 0A9 | 147 | 167 | 049 | 1A7 | 1C7 | 1E7 | 0E9 | 189 | 18A | 18B | 0C9 | 18D | 18E | 18F |
| 2  | 06A | 0AA | 052 | 053 | 04A | 055 | 056 | 057 | 0EA | 059 | 05A | 05B | 0CA | 05D | 05E | 05F |
| 3  | 06B | 0AB | 072 | 073 | 04B | 075 | 076 | 077 | 0EB | 079 | 07A | 07B | 0CB | 07D | 07E | 07F |
| 4  | 666 | 0A6 | 092 | 093 | 046 | 095 | 096 | 097 | 0Ee | 099 | 09A | 098 | 0C6 | 09D | 09E | 09F |
| 5  | 06D | 0AD | 0B2 | 0B3 | 040 | 085 | 0B6 | 0B7 | 0ED | 0B9 | 0BA | 0BB | 0CD | 0BD | 0BE | 0BF |
| 6  | 06E | 0AE | 0D2 | 003 | 04E | 0D5 | 0D6 | 0D7 | 0EE | 0D9 | 0DA | 0DB | 0CE | 000 | 00E | 0DF |
| 7  | 06F | 0AF | 0F2 | 0F3 | 04F | 0F5 | 0F6 | 0F7 | 0EF | 0F9 | 0FA | 0FB | 0CF | 0FD | 0FE | 0FF |
| 8  | 165 | 1A5 | 112 | 113 | 145 | 126 | 116 | 117 | 1E5 | 12A | 11A | 11B | 1C5 | 12E | 11E | 11F |
| 9  | 169 | 1A9 | 132 | 133 | 139 | 127 | 136 | 137 | 1E9 | 12B | 13A | 13B | 1C9 | 12F | 13E | 13F |
| A  | 16A | 1AA | 152 | 153 | 14A | 155 | 156 | 157 | 1EA | 159 | 15A | 15B | 1CA | 15D | 15E | 15F |
| B  | 16B | 1AB | 172 | 173 | 14B | 175 | 176 | 177 | 1EB | 179 | 17A | 17B | 1CB | 17D | 17E | 17F |
| C  | 166 | 1A6 | 192 | 193 | 146 | 195 | 196 | 197 | 1E6 | 199 | 19A | 19B | 1C6 | 19D | 19E | 19F |
| D  | 16b | 1AD | 1B2 | 1B3 | 14D | 1B5 | 1B6 | 1B7 | 1ED | 1B9 | 1BA | 1BB | 1CD | 1BD | 1BE | 1BF |
| E  | 16E | 1AE | 1D2 | 1D3 | 14E | 1D5 | 1D6 | 1D7 | 1EE | 1D9 | 1DA | 1DB | 1CE | 1DD | 1DE | 1DF |
| F  | 16F | 1AF | 1F2 | 1F3 | 14F | 1F5 | 1F6 | 1F7 | 1EF | 1F9 | 1FA | 1FB | 1CF | 1FD | 1FE | 1FF |

19. A method for decoding a binary data sequence $X_k$ from a codeword $Y_l$ encoded in a data encoding method including the steps of dividing a binary data sequence $X_k$ having a predetermined number of bits (k) into a first group and a second group of bits, encoding sequence A ($A_7$, $A_6$, ..., $A_0$) of the first group of bits by a sub-encoder of a predetermined number of bits to satisfy conditions of $C_8+C_7+C_6=1$, $C_1+C_0=1$, $C_7+C_6+C_5+C_4=1$, $C_6+C_5+C_4+C_3=1$, $C_3+C_2+C_1=1$, $C_4+C_3+C_1=1$, and $C_7+C_6+C_1=1$, wherein the output of the sub-encoder is a sequence C ($C_8$, $C_7$, $C_6$, ..., $C_0$), by bypassing a sequence B ($B_7$, $B_6$, ..., $B_0$) of the second group of bits, and interleaving the sequence C ($C_8$, $C_7$, $C_6$, ..., $C_0$) encoded by the sub-encoder with the bypassed sequence B ($B_7$, $B_6$, ..., $B_0$), and outputting a codeword $Y_l$ having a predetermined number of bits (l), comprising the steps of:

(a) dividing the codeword $Y_l$ into two groups of W1 and W2 satisfying conditions of $W_1=[C_8,C_7,C_6,B_5,B_4,B_3,B_2,C_1,C_0]$ and $W_2=[B_7,B_6,C_5,C_4,C_3,C_2,B_1,B_0]$;

(b) decoding the group W1 with a sub-decoder of a predetermined number of bits;

(c) bypassing the group W2; and (d) interleaving data sequences output from step b with the bypassed group W2, and outputting the binary data sequence $X_k$ having a predetermined number of bits (k).

20. The decoding method of claim 19, wherein the decoding of step b is performed using the following table

| MS | \|   | \|   | \|   | \|   | \|   | \|   | LS  | \|   | \|   | \|   | \|   | \|   | \|   | \|   | \|   |
|----|-----|-----|-----|-----|-----|-----|-----|-----|-----|-----|-----|-----|-----|-----|-----|-----|
|    | 0   | 1   | 2   | 3   | 4   | 5   | 6   | 7   | 8   | 9   | A   | B   | C   | D   | E   | F   |
| 0  | 065 | 0A5 | 047 | 067 | 045 | 0A7 | 0C7 | 0E7 | 0E5 | 089 | 08A | 08B | 0C5 | 08D | 08E | 08F |
| 1  | 069 | 0A9 | 147 | 167 | 049 | 1A7 | 1C7 | 1E7 | 0E9 | 189 | 18A | 18B | 0C9 | 18D | 18E | 15F |
| 2  | 06A | 0AA | 052 | 053 | 04A | 055 | 056 | 057 | 0EA | 059 | 05A | 05B | 0CA | 050 | 05E | 05F |
| 3  | 06B | CAB | 072 | 07  | 04B | 075 | 076 | 077 | 0EB | 079 | 07A | 07B | 0GB | 07D | 07E | 07F |
| 4  | 066 | 0A6 | 092 | 093 | 046 | 095 | 096 | 097 | 0E6 | 099 | 09A | 09B | 0C6 | 09D | 09E | 09F |
| 5  | 06D | 0AD | 0B2 | 0B3 | 040 | bB5 | 0B6 | 0B7 | 0ED | 0B9 | 0BA | 0BB | 0CD | 0BD | 0BE | 0BF |
| 6  | 06E | 0AE | 0D2 | 0D3 | 04E | 0D5 | 0D6 | 0D7 | 0EE | 0D9 | 0DA | 0DB | 0CE | 0DD | 0DE | 0DF |
| 7  | 06F | 0AF | 0F2 | 0F3 | 04F | 0F5 | 0F6 | 0F7 | 0EF | 0F9 | 6FA | 0FB | 0CF | 0FD | 0FE | 0FF |
| 8  | 165 | 1A5 | 112 | 113 | 145 | 126 | 116 | 117 | 1E5 | 12A | 11A | 11B | 1C5 | 12E | 11E | 11F |
| 9  | 169 | 1A9 | 132 | 133 | 139 | 127 | 136 | 137 | 1E9 | 12B | 13A | 13B | 1C9 | 12F | 13E | 13F |
| A  | 16A | 1AA | 152 | 153 | 14A | 155 | 156 | 157 | 1EA | 159 | 15A | 15B | 1CA | 15D | 15E | 15F |
| B  | 16B | 1AB | 172 | 173 | 14B | 175 | 176 | 177 | 1EB | 179 | 17A | 17B | 1CB | 17D | 17E | 17F |
| C  | 186 | 1A6 | 192 | 193 | 146 | 195 | 196 | 197 | 1E6 | 199 | 19A | 19B | 1C6 | 19D | 19E | 19F |
| D  | 16D | 1AD | 1B2 | 1B3 | 14D | 1B5 | 1B6 | 1B7 | 1ED | 1B9 | 1BA | 1BB | 1CD | 1BD | 1BE | 1BF |
| E  | 16E | 1AE | 1D2 | 1D3 | 14E | 1D5 | 1D6 | 1D7 | 1EE | 1D9 | 1DA | 1DB | 1CE | 1DD | 1DE | 1DF |
| F  | 16F | 1AF | 1F2 | 1F3 | 14F | 1F5 | 1F6 | 1F7 | 1EF | 1F9 | 1FA | 1FB | 1CF | 1FD | 1FE | 1FF |

\* \* \* \* \*